United States Patent
Abou-El-Sonoun et al.

(10) Patent No.: US 9,325,316 B1
(45) Date of Patent: Apr. 26, 2016

(54) LOW-POWER HIGH SWING CML DRIVER WITH INDEPENDENT COMMON-MODE AND SWING CONTROL

(71) Applicant: BROADCOM CORPORATION, Irvine, CA (US)

(72) Inventors: Amr Amin Hafez Amin Abou-El-Sonoun, Irvine, CA (US); Ramy Awad, Irvine, CA (US); Mohammed Abdul-Latif, Irvine, CA (US); Adesh Garg, Aliso Viejo, CA (US); Henry Park, Irvine, CA (US); Anand Jitendra Vasani, Irvine, CA (US); Ullas Singh, Irvine, CA (US); Namik Kemal Kocaman, San Clemente, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/709,368

(22) Filed: May 11, 2015

Related U.S. Application Data

(60) Provisional application No. 62/151,961, filed on Apr. 23, 2015.

(51) Int. Cl.
*H03L 5/02* (2006.01)
*H03K 19/0185* (2006.01)

(52) U.S. Cl.
CPC .............. *H03K 19/018514* (2013.01)

(58) Field of Classification Search
CPC .............. H03K 19/018528; H03K 19/018507; H03K 19/0013
USPC .......................... 326/83, 80, 81, 68
See application file for complete search history.

(56) References Cited

U.S. PATENT DOCUMENTS

| | | | |
|---|---|---|---|
| 7,671,655 B2 * | 3/2010 | Takenaka | H03K 19/018521 326/81 |
| 8,134,399 B2 * | 3/2012 | Chen | H03K 19/018521 326/80 |

* cited by examiner

*Primary Examiner* — Daniel D Chang
(74) *Attorney, Agent, or Firm* — McDermott Will & Emery LLP

(57) ABSTRACT

A low-power high-swing current-mode logic (CML) driver circuit includes a first differential-pair and a second differential-pair. The first differential-pair includes first transistors, and is coupled to a first voltage supply that supplies a first voltage. The second differential-pair includes second transistors, and a common node of the second differential-pair is coupled to a second voltage supply. The second voltage supply supplies a second voltage that is higher than the first voltage. Control terminals of the first transistors are coupled to control terminals of the second transistors to form input nodes of the driver circuit.

20 Claims, 4 Drawing Sheets

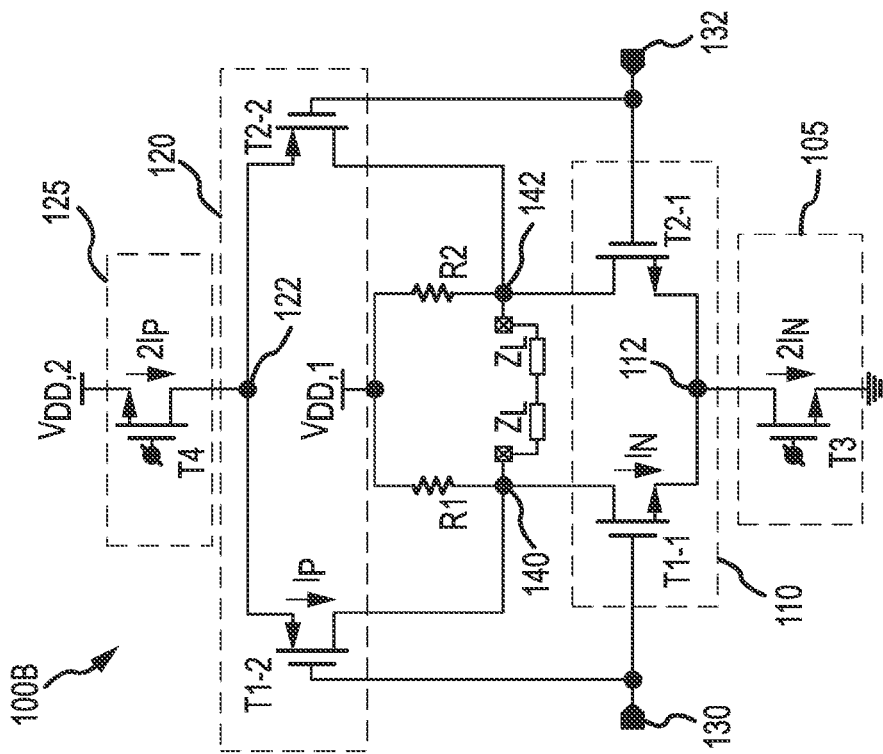
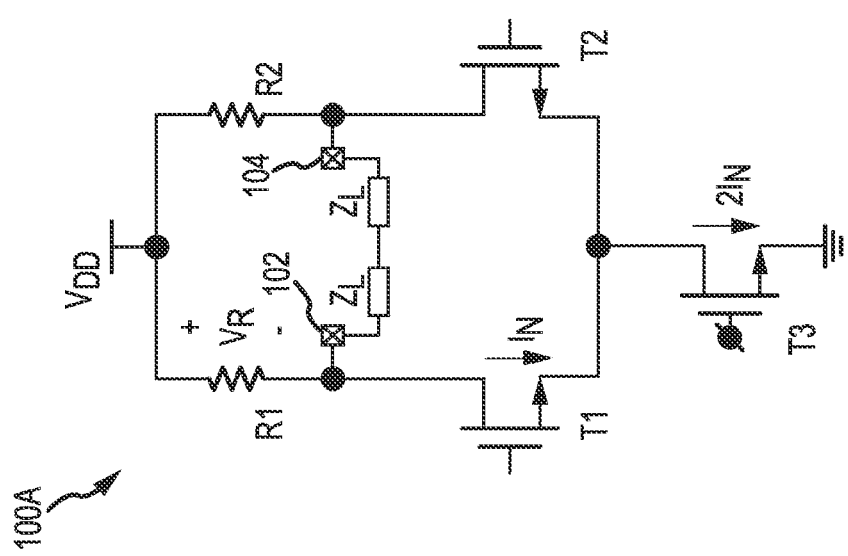
FIG. 1B
FIG. 1A

LOW-POWER HIGH SWING CML DRIVER WITH INDEPENDENT COMMON-MODE AND SWING CONTROL

CROSS-REFERENCE TO RELATED APPLICATIONS

This application claims the benefit of priority under 35 U.S.C. §119 from U.S. Provisional Patent Application 62/151,961 filed Apr. 23, 2015, which is incorporated herein by reference in its entirety.

TECHNICAL FIELD

The subject technology generally relates to integrated circuits and, in particular, relates to a low-power high swing current-mode logic (CML) driver with independent common-mode and swing control.

BACKGROUND

Current mode logic (CML) circuits are commonly used as drivers in many wired communication applications, for example, in chip-to-chip interconnections of integrated circuits (ICs). High voltage swing in a conventional CML binary or multi-level driver has to have a proportional voltage drop across a respective load resistance, which can cause two problems. First, a low headroom for the differential pair lowers corresponding output impedance which degrades the driver's return loss. Second, a low headroom for the tail current source causes the tail current to vary with process, voltage, and temperature (PVT) corners that makes the output amplitude poorly defined. Solving these problems by using a higher voltage supply, if available, increases the power consumption significantly.

In a conventional CML driver, assuming a 100-Ohm differential load resistance and a 1-V peak-to-peak differential swing, the tail bias current has to be greater than or equal to 20 mA. This translates into a voltage drop across the load resistors that is greater than or equal 500 mV. As the output starts to swing, each output has to swing down to 250 mV in order to get the desired 1-V overall swing. This leaves very low headroom for the differential pair to have enough output resistance and for the tail current source to have a well-defined output current.

Three techniques are currently used to alleviate the headroom problems, none of which is effective enough to solve the problem. For example, using large low-VT devices for the differential pair, to give some extra voltage headroom for the current source, degrades the output return loss and bandwidth of the driver in addition to loading the pre-driver. Using an active current mirror for the tail current source to improve the current accuracy consumes extra power and large area (e.g., for the compensation cap) and is not effective at high frequencies as it can cause inter-symbol interference (ISI), in addition to not solving the bad return loss problem. Increasing power voltage supply (e.g., to 1.5V) instead of 1V can cause the power consumption to increase by ~50%, for example, from 20 mW to 30 mW.

BRIEF DESCRIPTION OF THE DRAWINGS

Certain features of the subject technology are set forth in the appended claims. However, for purpose of explanation, several embodiments of the subject technology are set forth in the following figures.

FIG. 1A illustrates an example of a current mode logic (CML) driver circuit.

FIG. 1B illustrates an example of a low-power high-swing CML driver circuit, in accordance with one or more implementations.

DETAILED DESCRIPTION

Figure 2:
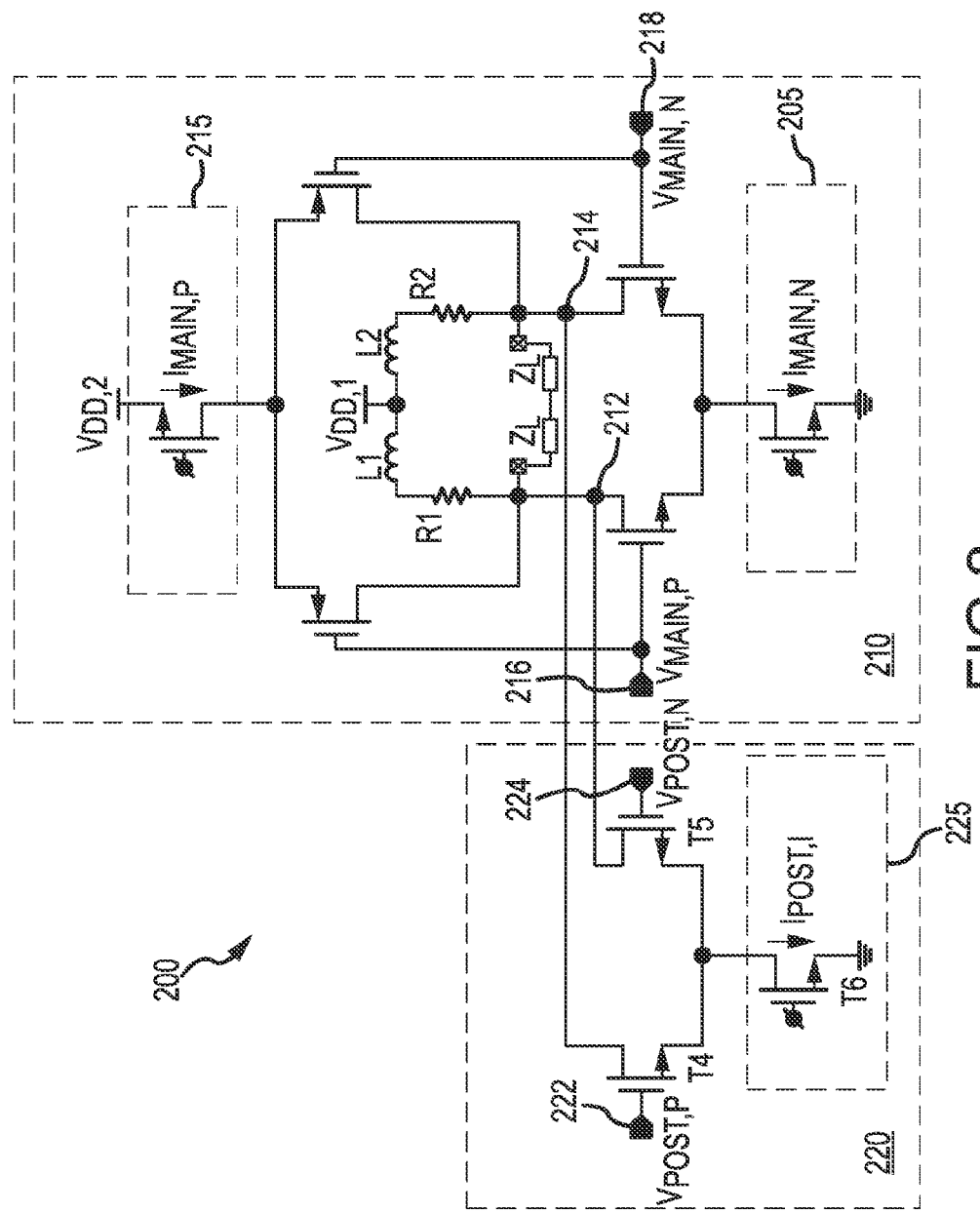
FIG. 2 illustrates an example of a low-power high-swing CML driver circuit with bandwidth extension and additional taps, in accordance with one or more implementations.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In one or more aspects of the subject technology, methods and implementations for a low-power high-swing current-mode logic (CML) driver with independent common-mode, output swing, and bandwidth control are described. The subject technology provides a number of advantageous features at circuit, system, and product levels. For example, the disclosed technology allows a driver to have a high voltage swing at the output without sacrificing swing control accuracy and good output return loss or having a significant power increase.

FIG. 1A illustrates an example of a CML driver circuit 100A. The CML driver circuit 100A includes a differential pair consisting of transistors T1 and T2 (e.g., NMOS transistors). Drain terminals of the transistors T1 and T2 are coupled through load resistors R1 and R2 (e.g., R1=R2=50Ω) to a voltage supply $V_{DD}$ (e.g., 1V). Source terminals of the transistors T1 and T2 are coupled through a tail current source formed by a transistor T3 to ground potential. It is understood that for the CML driver circuit 100A to have a desirable output return loss (e.g., better than 12 dB), the differential output resistance of the driver (e.g., looking into output nodes 102 and 104) has to be greater than or equal to ~60Ω. For example, for a ~50Ω resistance value of the load resistors R1 and R2, in order to achieve a differential swing of ~1V peak-to-peak, at the output nodes 102 and 104 (e.g., across load impedances $Z_L$), the tail current (e.g., $2I_N$) has to be greater than or equal to ~20 mA, which translates into a voltage drop across each of the load resistors R1 or R2 of greater than or equal to ~500 mV.

With the output starting to swing, voltage at each output node (e.g., 102 or 104) has to swing down to ~250 mV to achieve the desired ~1V peak-to-peak differential swing. Such a differential swing leaves very low headroom for the differential pair to have sufficient output resistance and for the tail current source (e.g., T3) to have well-defined output current variations associated with process, voltage, and temperature (PVT) corners. The current solutions are either not effective enough to alleviate these problems or result in higher power consumption and/or excessive increase in chip real estate.

FIG. 1B illustrates an example of a low-power high-swing CML driver circuit 100B, in accordance with one or more implementations of the subject technology. The low-power high-swing CML driver circuit 100B (hereinafter "CML driver circuit 100B") includes a first differential-pair 110 and a second differential-pair 120. The first differential-pair 110 includes first transistors T1-1 and T2-1, and the second differential-pair 120 includes second transistors T1-2 and T2-2. The first differential pair 110 is coupled to a first voltage supply $V_{DD,1}$ that supplies a first voltage. A common node 122 of the second differential-pair 120 is coupled to a second voltage supply $V_{DD,2}$ that supplies a second voltage that is higher than the first voltage. In some implementations, the first voltage can be ~1V and the second voltage can be ~1.5V, but the values of the first and second voltage are not restricted to these values.

In one or more implementations, the first transistors T1-1 and T2-1 include NMOS transistors and the second transistors T1-2 and T2-2 include PMOS transistors. Control terminals (e.g., gate terminals) of the first transistors T1-1 and T2-1 are coupled to control terminals (e.g., gate terminals) of the second transistors T1-2 and T2-2 and form input nodes 130 and 132 of the CML driver circuit 100B. The drain terminals of the transistors T1-1 and T2-1 of the first differential pair 110 are coupled to drain terminals of the transistors T1-2 and T2-2 of the second differential pair 120 at output differential nodes 140 and 142. The load resistors R1 and R2 (e.g., R1=R2=500) are coupled between the voltage supply $V_{DD,1}$ and output differential nodes 140 and 142, which are connected to load impedances (e.g., $Z_L$).

A common node 112 of the first differential-pair 110 is coupled through a first current source 105 to ground potential. The first current source 105 can be implemented by transistor T3 (e.g., an NMOS transistor), of which a source and a gate terminal are coupled to the ground potential, and the drain terminal is coupled to the common node 112 of the first differential-pair 110. The common node 122 of the second differential-pair 120 is coupled to the second voltage supply $V_{DD,2}$ through a second current source 125. The second current source 125 can be implemented by transistor T4 (e.g., a PMOS transistor), of which a source terminal is coupled to the second voltage supply $V_{DD,2}$, the gate terminal is couple to the ground potential, and the drain terminal is coupled to the common node 122.

The addition of the second differential-pair 120 (e.g., the PMOS pair) driven by a higher voltage supply (e.g., 1.5V) helps by splitting to total required transconductance Gm of the driver circuit between the first and the second differential-pairs 110 and 120. In other words, PMOS pair helps the first differential-pair 110 in providing the current that passes through the first current source 105. For example, if the current $2I_N$ passing through the first current source 105 is ~15 mA, a first portion of ~5 mA of this current is provides by the second current source 125 through the PMOS transistors T1-2 and T2-2, and a second portion (~10 mA) is provided by the first voltage supply $V_{DD,1}$. Only the second portion contributes to the headroom problem of the first differential-pair transistors T1-1 and T2-1 and the first current source 105. This splitting between the first differential-pair 110 (e.g., the NMOS pair) and the second differential-pair 120 (e.g., the PMOS pair) does not cause any overhead in input capacitance, output capacitance, or output resistance of the CML driver circuit 100B, particularly at current and future technology nodes (e.g., 28 nm and lower), as the difference between the NMOS and PMOS transistors is shrinking at these technology nodes.

In some implementations, with resistance value the load resistors R1 and R2 equal to ~50Ω, the total consumption power of the CML driver circuit 100B can be lower (e.g., by ~13%) as compared to the CML driver circuit 100A of FIG. 1A. This a significant power saving, especially, when compared with the existing solutions that can result in ~50% increase in power consumption. The CML driver circuit 100B can be applied as both return-to-zero (RZ) and non-return-to-zero (NRZ) transmitter driver. The subject technology, as implemented by the example CML driver circuit 100B, has advantages over an H-bridge implementation as well. For instance, the input signal of the CML driver circuit 100B is a CML signal as opposed to a rail-to-rail signal of an H-bridge circuit, which requires a substantially higher power from a pre-driver circuit. Further, in the CML driver circuit 100B, the input devices (e.g., transistors T1-1, T2-1, T1-2, and T2-2) act as differential pairs that can isolate the capacitance at the common source node 112 from the output nodes 140 and 142, in contrast to the H-bridge circuit, in which the input devices act as switches and cause the common source node capacitance to load the output.

FIG. 2 illustrates an example of a low-power high-swing CML driver circuit 200 with bandwidth extension and additional taps, in accordance with one or more implementations of the subject technology. The CML driver circuit 200 includes a core CML driver circuit 210 and one or more taps 220. The core CML driver 210 is similar to the CML driver circuit 100B of FIG. 1B, except for the addition of inductors L1 and L2, which are coupled between the first voltage supply $V_{DD,1}$ and the load resistors R1 and R2. The inductors L1 and L2 can extend the bandwidth of the CML driver through inductive peaking by compensating for the capacitive load of the interconnects. In some implementations, inductance values of the inductors L and L2 can be the same, and for example, in the order of 1 nH. Another important aspect of the subject technology relates to independent control of the output differential and common-mode (CM) signal amplitudes. For example, the output common-mode signal amplitude can be controlled by controlling a difference between current amplitudes of the current sources 205 and 215, because this difference current passes through the load resistors R1 and R2 (e.g., R1=R2=50Ω), which sets the output CM signal. The output differential-signal amplitude can be controlled by adjusting sum of the amplitudes of the currents of the current sources 205 and 215.

The tap circuit 220, also known as a post tap, includes a differential-pair formed of transistors T4 and T5 and a current source including a transistor T6. In some implementations, the transistors T4 and T5 are NMOS transistors, the drain terminals of which are coupled to the output nodes 212 and 214 of the core CML driver 210. The common source terminals of the NMOS transistors T4 and T5 are coupled to the drain terminal of a transistor T6 that forms the current source 225. The post tap input nodes 222 and 224 are the gate terminal of the transistors T4 and T5. The post tap 220 can be used, for example, for equalization purposes, where input data is applied to the main differential input nodes 216 and 218 and a delayed version of the input data is applied to the post tap input nodes 222 and 224 to generate a linear combination of the two (e.g., input data and its delayed version). The amount of equalization, for example can be controlled by adjusting the values of the currents (e.g., between 0-15 mA) of the current sources 205 and 225 of the core CML driver 210 and the post tap 220, respectively. In some implementations, more than one post tap 220 can be used and different delayed versions of the input signals with different delays can be employed to improve equalization. In one or more implementations, the tap circuit 220 can be formed by PMOS transistors (instead of NMOS transistors T4, T5, and T6) and be coupled in parallel with the second differential pair formed by transistors T1-2 and T2-2, In one or more implementations, one or more of the tap circuit 220 can be employed for non-binary or multi-level (e.g., m digital-to-analog (DAC)-based) signaling. For example, the most significant bit (MSB) can be applied to the core CML driver 210 and the other bits can be applied to additional tap circuits similar to the tap circuit 220, based on the number of levels. For instance, for a 4-level signaling with 2 bits of data, one additional tap circuit would be enough. When using the CML driver circuit 200 for multi-level signaling, the current amplitude of the current source 225 of the tap circuit 220 has to be half the amplitude of the current of the current source 205 of the core CML driver 210. Similar current source amplitude relation applies to additional tap circuits as well. For example, a current amplitude of current sources of a second and a third additional tap circuits (e.g., for two additional bits) have to be one-fourth (¼) and one-eighth (⅛) of the current amplitude of the current source 205, respectively, for proper operation of the circuits.

Figure 3:
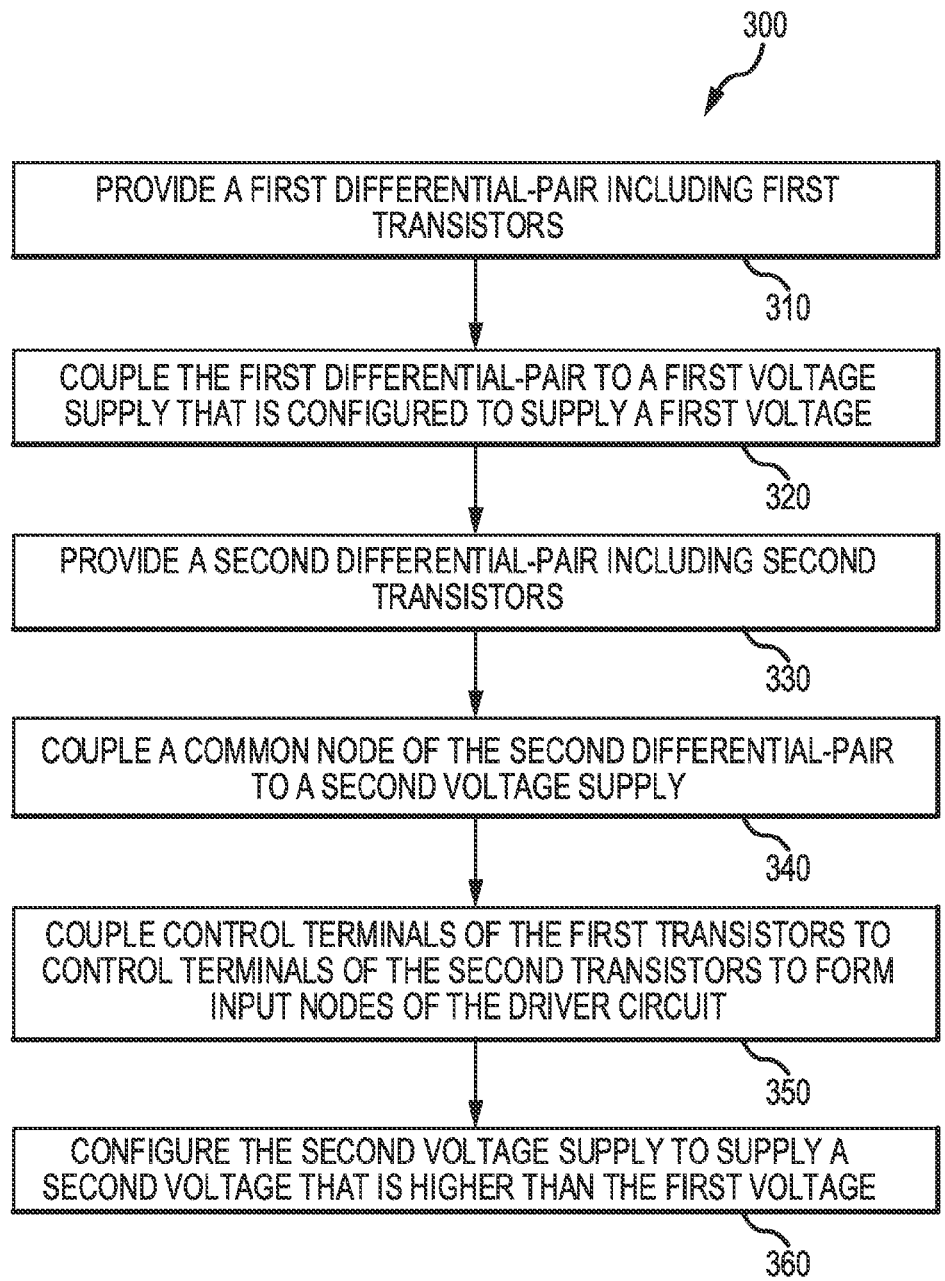
FIG. 3 illustrates an example of a method for providing a low-power high-swing CML driver circuit, in accordance with one or more implementations.

FIG. 3 illustrates an example of a method 300 for providing a low-power high-swing CML driver circuit, in accordance with one or more implementations of the subject technology. For explanatory purposes, the blocks of the example method 300 are described herein as occurring in serial, or linearly. However, multiple blocks of the example method 300 can occur in parallel. In addition, the blocks of the example method 300 have not be performed in the order shown and/or one or more of the blocks of the example method 300 have not be performed.

According to the method 300, a first differential-pair (e.g., 110 of FIG. 1B) is provided that includes first transistors (e.g., $T_{1-1}$ and $T_{2-1}$ of FIG. 1B) (310). The first differential-pair is coupled to a first voltage supply (e.g., $V_{DD,1}$ of FIG. 1B) that supplies a first voltage (320). A second differential-pair (e.g., 120 of FIG. 1B) is provided that includes second transistors (e.g., $T_{1-2}$ and $T_{22}$ of FIG. 1B) (330). A common node (e.g., 122 of FIG. 1B) of the second differential-pair is coupled to a second voltage supply (e.g., $V_{DD,2}$ of FIG. 1B) (340). Control terminals of the first transistors are coupled to control terminals of the second transistors to form input nodes (e.g., 130 and 132 of FIG. 1B) of the driver circuit (350). The second voltage supply can supply a second voltage (e.g., 1.5V) that is higher than the first voltage (e.g., 1V) (360).

Figure 4:
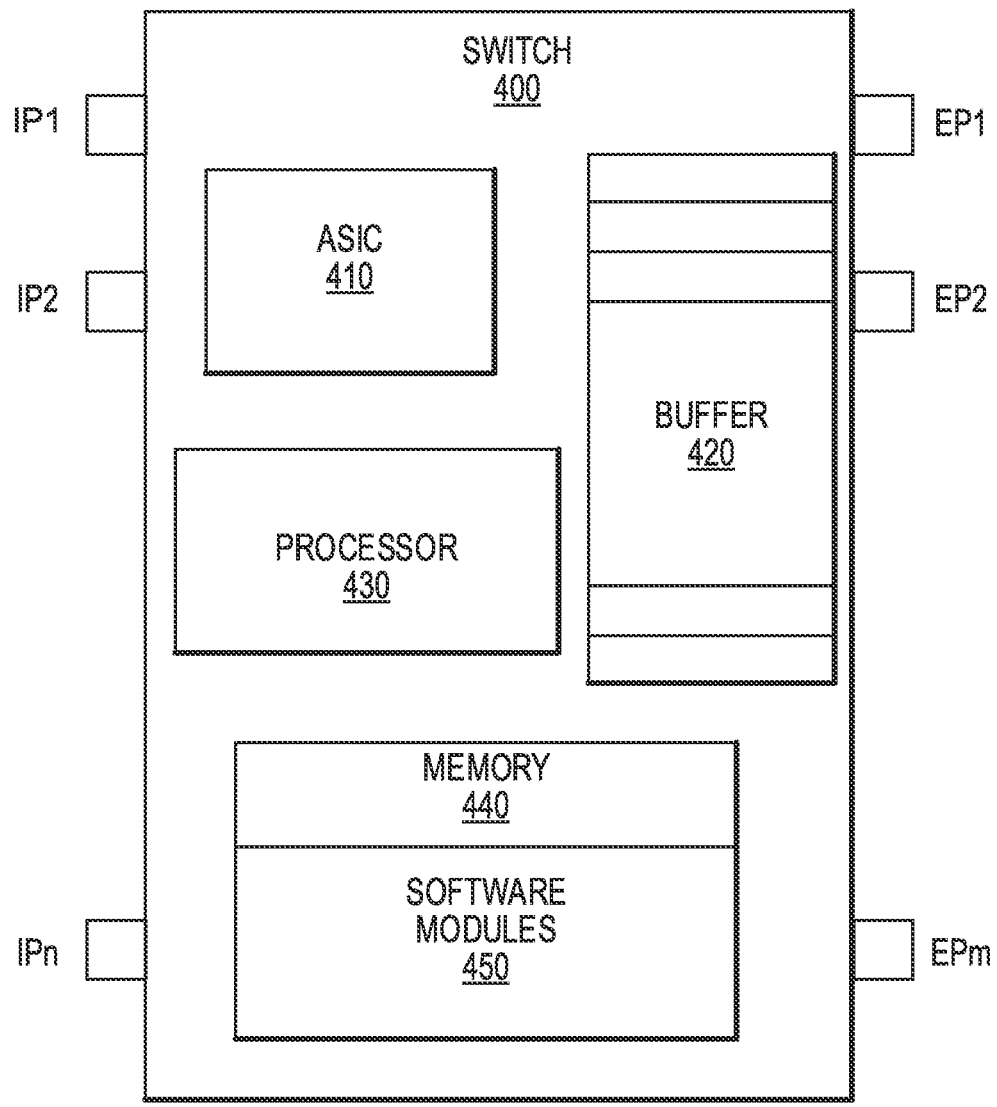
FIG. 4 illustrates an example of a wireless communication device employing features of the subject technology, in accordance with one or more implementations.

FIG. 4 illustrates an example of a communication device 400 employing features of the subject technology for providing a high-voltage fail-safe I/O interface circuit in accordance with one or more implementations of the subject technology. Examples of the communication device 400 includes an Ethernet switch of an Ethernet network such as a private network including a data-center network, an enterprise network, or other private networks. The communication device 400 includes a number of ingress (input) ports IP1-IPn and multiple egress (output) ports EP1-EPm. In one or more implementations, one or more of the ingress ports IP1-IPn can receive a data packet from another switch or and endpoint device of the network. The communication device 400 further includes a hardware component such as an application specific integrated circuit (ASIC) 410 (which in some embodiments can be implemented as a field-programmable logic array (FPGA)), a buffer 420, a processor 430, memory 440, and a software module 450.

In some implementations, the ASIC 410 can include suitable logic, circuitry, interfaces and/or code that can be operable to perform functionalities of a PHY circuit. The buffer 420 includes suitable logic, circuitry, code and/or interfaces that are operable to receive and store and/or delay a block of data for communication through one or more of the egress ports EP1-EPm. The processor 430 includes suitable logic, circuitry, and/or code that can enable processing data and/or controlling operations of the communication device 400. In this regard, the processor 430 can be enabled to provide control signals to various other portions of the communication device 400. The processor 430 also controls transfers of data between various portions of the communication device 400. Additionally, the processor 430 can enable implementation of an operating system or otherwise execute code to manage operations of the communication device 400.

The memory 440 includes suitable logic, circuitry, and/or code that can enable storage of various types of information such as received data, generated data, code, and/or configuration information. The memory 440 includes, for example, RAM, ROM, flash, and/or magnetic storage. In various embodiment of the subject technology, the memory 440 can include a RAM, DRAM, SRAM, T-RAM, Z-RAM, TTRAM, or any other storage media. The memory 440 can include software modules 450 that when executed by a processor (e.g., processor 430) can perform some or all of the functionalities of the ASIC 410. In some implementations, the software modules 450 include codes that when executed by a processor can perform functionalities such as configuration of the communication device 400.

In some implementations, various chips of the communication device 400 can be coupled to one another (e.g., a first chip such as a processor chip and a second chip such as a memory chip) using the low-power high-swing CML driver circuit of the subject technology (e.g., 100B of FIG. 1B).

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A low-power high-swing current-mode logic (CML) driver circuit, the driver circuit comprising:
   a first differential-pair comprising first transistors, the first differential pair being coupled to a first voltage supply configured to supply a first voltage, and a common node of the first differential-pair being coupled through a first current source to ground potential; and
   a second differential-pair comprising second transistors, wherein:
   a common node of the second differential-pair is coupled to a second voltage supply configured to supply a second voltage that is higher than the first voltage, and
   control terminals of the first transistors are coupled to control terminals of the second transistors to form input nodes of the driver circuit.

2. The driver circuit of claim 1, wherein the common node of the second differential-pair is coupled through a second current source to the second voltage supply.

3. The driver circuit of claim 1, wherein the first transistors comprise NMOS transistors and the second transistors comprise PMOS transistors, and wherein the control terminals comprise gate terminals.

4. The driver circuit of claim 3, further comprising two resistors coupled to drain terminals of the first NMOS transistors; and two bandwidth extension inductors coupled between the two resistors and the first voltage supply, wherein the two resistors comprise 50-Ohm resistors.

5. The driver circuit of claim 2, wherein the first voltage is 1 volt (V) and the second voltage is 1.5V, and wherein the first current source comprises an NMOS transistor and the second current source comprises a PMOS transistor.

6. The driver circuit of claim 1, wherein the second differential-pair is configured to assist the first differential-pair in providing a current passing through the first current source.

7. The driver circuit of claim 1, further comprising one or more additional taps for application in a binary transmitter driver, wherein the one or more additional taps comprise pre-emphasis taps used for equalization, wherein the driver circuit is configured to be applied as a return-to-zero (RZ) or a non-return-to-zero (NRZ) transmitter driver.

8. The driver circuit of claim 7, wherein an additional tap of the one or more additional taps comprise an additional differential-pair coupled in parallel with the first differential pair or the second differential pair.

9. The driver circuit of claim 7, wherein the input nodes of the driver circuit are configured to be coupled to a most significant bit of a multilevel signal and the one or more additional taps are configured to be coupled to additional bits of the multilevel signal.

10. The driver circuit of claim 2, wherein the first and second current sources are configured to enable independent amplitude control of an output differential signal and an output common-mode signal.

11. A method for providing a low-power high-swing current-mode logic (CML) driver circuit, the method comprising:
    providing a first differential-pair comprising first transistors;
    coupling the first differential-pair to a first voltage supply that is configured to supply a first voltage;
    coupling a common node of the first differential-pair through a first current source to ground potential;
    providing a second differential-pair comprising second transistors;
    coupling a common node of the second differential-pair to a second voltage supply;
    coupling control terminals of the first transistors to control terminals of the second transistors to form input nodes of the driver circuit; and
    configuring the second voltage supply to supply a second voltage that is higher than the first voltage.

12. The method of claim 11, further comprising
    coupling a common node of the second differential-pair through a second current source to the second voltage supply.

13. The method of claim 11, wherein the first transistors comprise NMOS transistors and the second transistors comprise PMOS transistors, wherein the control terminals comprise gate terminals, and wherein the method further comprises:
    coupling two resistors to drain terminals of the first NMOS transistors; and
    coupling two bandwidth extension inductors between the two resistors and the first voltage supply,
    wherein the two resistors comprise 50-Ohm resistors.

14. The method of claim 12, wherein the first voltage is 1 volt (V) and the second voltage is 1.5V, wherein the first current source comprises an NMOS transistor and the second current source comprises a PMOS transistor, and wherein the method further comprises configuring the second differential-pair to assist the first differential-pair in providing a current passing through the first current source.

15. The method of claim 11, further comprising:
    providing one or more additional taps for application in a binary transmitter driver, and
    configuring the driver circuit to be applied as a Return-to-Zero (RZ) or a non-return-to-zero (NRZ) transmitter driver,
    wherein the one or more additional taps comprise pre-emphasis taps used for equalization.

16. The method of claim 15, wherein an additional tap of the one or more additional taps comprise an additional differential-pair coupled in parallel with the first differential pair or the second differential pair.

17. The method of claim 15, further comprising:
    configuring the input nodes of the driver circuit to be coupled to a most significant bit of a multilevel signal; and
    configuring the one or more additional taps to be coupled to additional bits of the multilevel signal.

18. The method of claim 12, further comprising configuring the first and second current sources to enable independent amplitude control of an output differential signal and an output common-mode signal.

19. A communication device, comprising:
    a first chip comprising first circuitry; and
    a second chip comprising second circuitry,
    wherein the first chip is coupled to the second chip using a low-power high-swing current-mode logic (CML) driver circuit comprising:
        a first differential-pair comprising first transistors, the first differential pair being coupled to a first voltage supply configured to supply a first voltage; and
        a second differential-pair comprising second transistors, wherein:
        a common node of the first differential-pair is coupled through a first current source to ground potential,
        a common node of the second differential-pair is coupled to a second voltage supply configured to supply a second voltage that is higher than the first voltage, and
        control terminals of the first transistors are coupled to control terminals of the second transistors to form input nodes of the driver circuit.

20. The communication device of claim 19, wherein:
    a common node of the second differential-pair is coupled through a second current source to the second voltage supply,
    the first transistors comprise NMOS transistors and the second transistors comprise PMOS transistors, and
    wherein the control terminals comprise gate terminals.

* * * * *